(12) United States Patent
Kashkoush et al.

(10) Patent No.: US 7,976,718 B2
(45) Date of Patent: Jul. 12, 2011

(54) SYSTEM AND METHOD FOR SELECTIVE ETCHING OF SILICON NITRIDE DURING SUBSTRATE PROCESSING

(75) Inventors: Ismail Kashkoush, Orefield, PA (US); Gim-Syang Chen, Allentown, PA (US); Richard Novak, Plymouth, MN (US)

(73) Assignee: Akrion Systems LLC

( * ) Notice: Subject to any disclaimer, the term of this patent is extended or adjusted under 35 U.S.C. 154(b) by 1077 days.

(21) Appl. No.: 10/585,229

(22) PCT Filed: Dec. 30, 2004

(86) PCT No.: PCT/US2004/043887
§ 371 (c)(1),
(2), (4) Date: Apr. 20, 2007

(87) PCT Pub. No.: WO2005/067019
PCT Pub. Date: Jul. 21, 2005

(65) Prior Publication Data
US 2008/0035609 A1 Feb. 14, 2008

Related U.S. Application Data

(60) Provisional application No. 60/533,097, filed on Dec. 30, 2003.

(51) Int. Cl.
*C03C 15/00* (2006.01)
(52) U.S. Cl. ............... 216/93; 216/103; 438/745

(58) Field of Classification Search ............ 438/745, 438/750, 7, 57; 156/345.11, 15; 216/106
See application file for complete search history.

(56) References Cited

U.S. PATENT DOCUMENTS

| | | | |
|---|---|---|---|
| 3,715,249 A | 2/1973 | Panousis | |
| 5,310,457 A | 5/1994 | Ziger | |
| 5,885,903 A | 3/1999 | Torek | |
| 6,087,273 A * | 7/2000 | Torek et al. ............ | 438/756 |
| 6,284,721 B1 | 9/2001 | Lee | |
| 6,376,261 B1 | 4/2002 | Campbell | |
| 2002/0102851 A1* | 8/2002 | Yokomizo et al. ...... | 438/689 |
| 2003/0011774 A1 | 1/2003 | DiBello | |
| 2003/0045098 A1 | 3/2003 | Verhaverbeke | |

* cited by examiner

*Primary Examiner* — Lan Vinh
(74) *Attorney, Agent, or Firm* — The Belles Group, P.C.

(57) ABSTRACT

A system (FIG. 5) and methods for selectively etching silicon nitride in the presence of silicon oxide that provide high selectivity while stabilizing silicon oxide etch rates. The invention comprises a processing chamber (10), dispense lines (20, 21, 22), feed lines (30, 31, 32), a recirculation line (40), a process controller (200), a concentration sensor (50), a particle counter (55), and a bleed line (90). The invention dynamically controls the concentration ratio of the components of the etchant being used and/or dynamically controls the particle count within the etchant during the processing of the at least one substrate. As a result etchant bath life is increased and etching process parameters are more tightly controlled.

16 Claims, 10 Drawing Sheets

SYSTEM AND METHOD FOR SELECTIVE ETCHING OF SILICON NITRIDE DURING SUBSTRATE PROCESSING

CROSS-REFERENCE TO RELATED APPLICATION

The present application claims the benefit of U.S. Provisional Application No. 60/533,097, filed Dec. 30, 2003, the entirety of which is incorporated herein by reference.

BACKGROUND OF THE INVENTION

As the dimensions of the microelectronic devices continuously decrease in size, now into the low nm scale, the wafer surface preparation procedures play an increasingly important role in IC manufacturing. The process chemicals, sequence, and number of cleaning steps are becoming more critical in determining the desired end results. As semiconductor manufacturing continues to advance, smaller and smaller devices are being designed and built on the same wafer surface area. These fine structures have created a new set of processing issues to the fab engineers and scientists. One of these problems is selectively etching silicon nitride ($Si_3N_4$) as compared to underlying silicon oxide films.

The etching of $Si_3N_4$ is currently achieved in a variety of ways, including plasma dry etching or reactive ion etching (RIE). However, RIE of $Si_3N_4$ fails to offer high selectivity to the underlying oxide films. In addition, RIE of $Si_3N_4$ can degrade, in the form of surface pitting, the underlying film or the silicon substrate. Another existing way to etch $Si_3N_4$ is through the application of phosphoric acid ($H_3PO_4$). The use of $H_3PO_4$ has been historically used due to its high etch selectivity of $Si_3N_4$ as compared to silicon dioxide ($SiO_2$). A typical $Si_3N_4$ etching reaction using $H_3PO_4$ can be described as follows:

$$3Si_3N_4 + 27H_2O + 4H_3PO_4 \rightarrow 4(NH_4)_3PO_4 + 9H_2SiO_3$$

Figure 1:
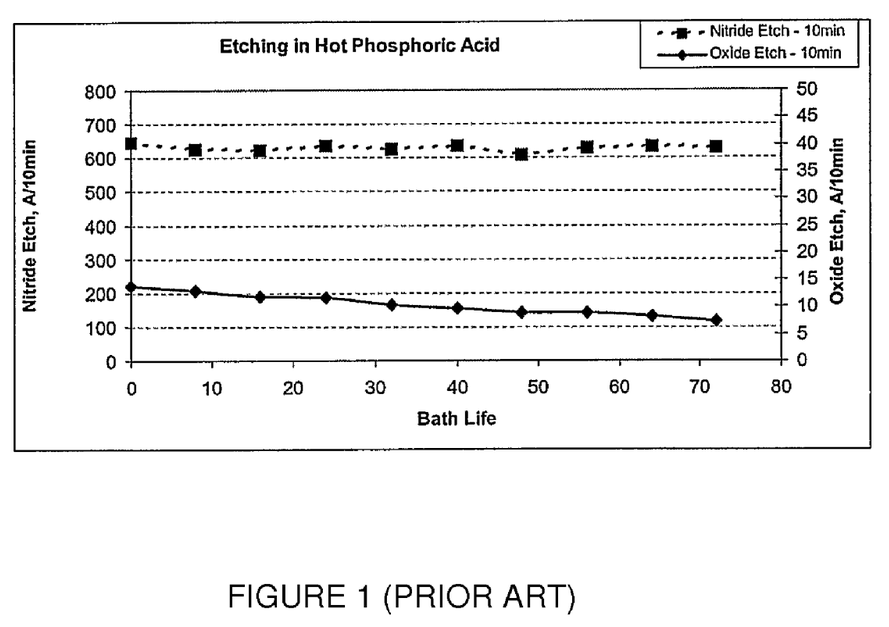
FIG. 1 is a graph comparing nitride and oxide etch rates as a function of the number of wafers processed using a prior art phosphoric acid only mix.
Figure 2:
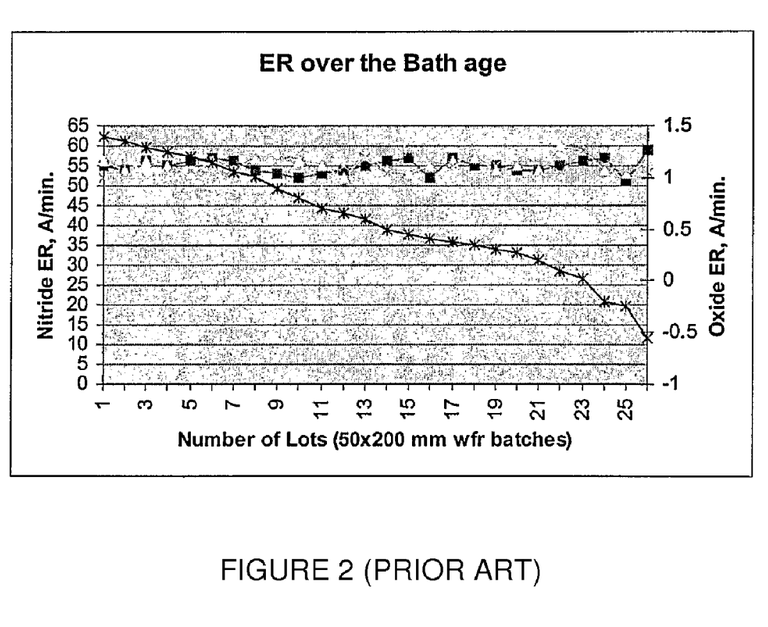
FIG. 2 is a graph comparing nitride to oxide etch rates as a function of time for batches of fifty 200 mm wafers using a prior art phosphoric acid only mix.

In this reaction, water hydrolyzes $Si_3N_4$ to form hydrous silica and ammonia. The ammonia remains in solution to form ammonium phosphate. The reaction suggests that water is an integral part of the chemistry to etch $Si_3N_4$. As nitride is etched, hydrated $SiO_2$ ($H_2OSiO_2$) is formed in the solution and inhibits the etching of $SiO_2$, i.e. it results in a higher selectivity. The $SiO_2$ etching continues to decrease, as shown in FIGS. 1 and 2, until the system (phosphoric acid liquid and wafers) reaches equilibrium (no mass transport), which at that time it stops. Once equilibrium is reached, an $SiO_2$ film apparently re-deposits. The bath life will be determined depending on the tolerance that a fab can allow with this re-deposition. While this slow of oxide etch rate is beneficial (i.e. higher selectivity) but this re-deposition will cause high particle counts on the wafer which is undesirable. This phenomenon is so noticeable that it can be predicted. As shown in FIG. 2, the particle levels were in about 40 particles added up to 21×50 wafer processed in the bath after which a considerable increase in these counts was noticed.

While a number of processes have been developed in an attempt to more selectively etch $Si_3N_4$ in comparison to silicon oxides during semiconductor manufacturing, existing systems are less than optimal and suffer from a number of drawbacks. For example, in U.S. Pat. No. 6,376,261 (the '261 Patent), a system is disclosed that has a control scheme to predict the etch rate at the wafer surfaces. This system measures the thickness of a thin film on the wafers and adjusts the system parameters based on the film thickness measurements of the previous run. The adjustments are done in between wafer batches, resulting in manufacturing down time and decreased etching selectivity within each batch of wafers as the etching solution becomes contaminated and/or the concentration ratio of its components change over time. Additionally, the system disclosed in the '261 Patent requires an advanced process control system (APC) at the IC fab level.

Additional etching systems are disclosed in U.S. Pat. No. 3,715,249 (the '249 Patent), U.S. Pat. No. 6,087,273 (the '273 Patent), and U.S. Pat. No. 5,885,903 (the '903 Patent). While these systems attempt to achieve selective etching, using a mix of sulfuric and phosphoric acid, these systems do not contain a control system to ensure maximum selectivity in the etching by controlling process and mixture parameters. Thus, these systems result in decreased etching selectivity within each batch of wafers as the etching solution becomes contaminated and/or the concentration ratio of its components change over time.

In U.S. Pat. No. 5,310,457, an etching system is disclosed that utilizes the addition of HF and nitric acids to phosphoric acids to increase the etching selectivity of nitride to silicon oxide. However, the addition of HF and nitric acids to phosphoric acids has proved to be less than optimal in performance.

Figure 3:
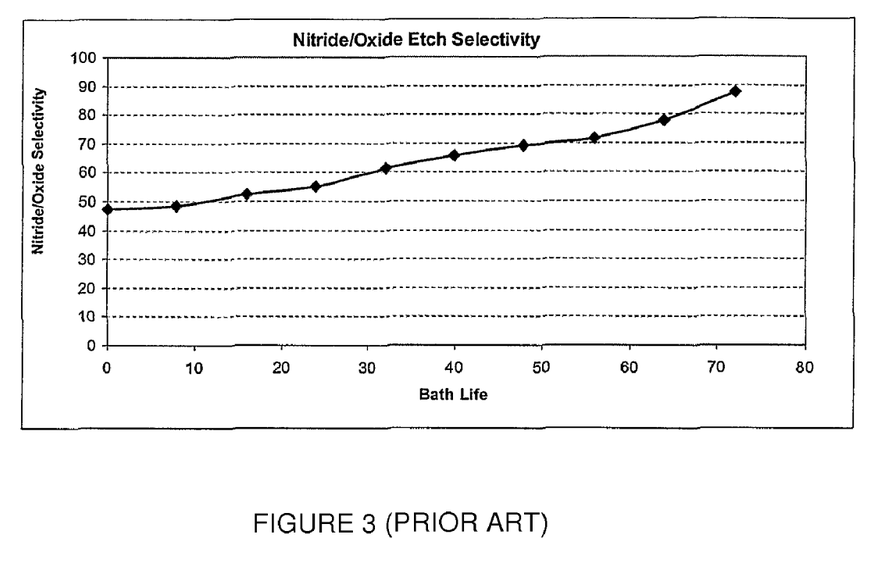
FIG. 3 is a graph illustrating the selectivity of the silicon nitride etch rate to the silicon oxide etch rate as a function of time for batches of fifty 200 mm wafers using a prior art phosphoric acid only mix.
Figure 4:
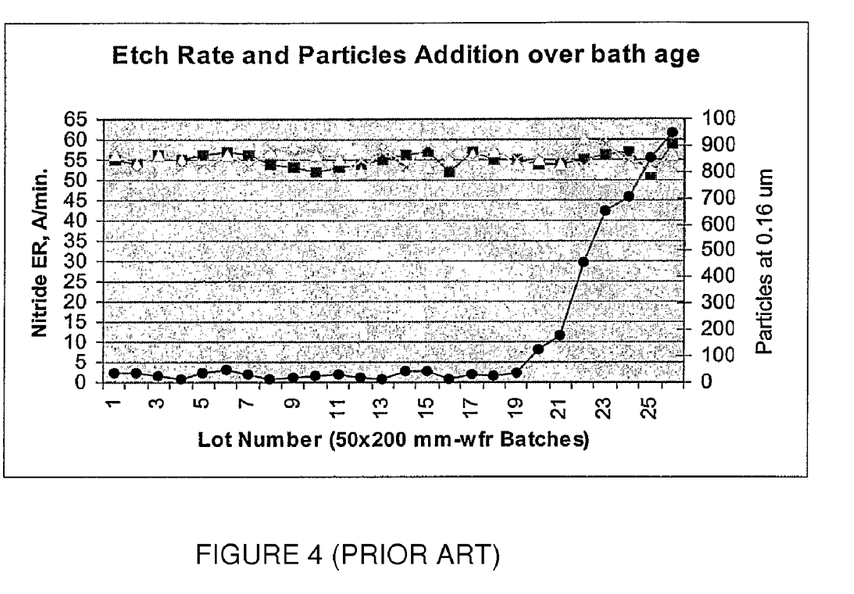
FIG. 4 is a graph comparing particles and etch rate as a function of the number of processed wafers using a prior art phosphoric acid only mix.

Finally, while some prior art etching systems and methods can achieve high selectivity in etching silicon nitride to silicon dioxide, maximization of etch selectivity is not a satisfactory sole goal. Consistent and steady etch rates for both the silicon nitride etch and the silicon oxide etch are also desirable. As mentioned above, FIG. 1 shows the results obtained from a conventional silicon nitride etch system using phosphoric acid (85% wt) at 165 C. As you can be seen, the nitride etch rate is stable while the oxide etch rate decreases with the number of wafers processed. Similar behavior is shown in FIG. 2 where the nitride and oxide etch rates were monitored against time in hours. The selectivity (i.e., the silicon nitride etch rate/silicon oxide etch rate) is plotted in FIG. 3. Because of the continuous drop in silicon oxide etch rate, the selectivity is obviously increasing with time. While this trend is a good one because it provides minimized silicon oxide loss, it also restricts the type of wafers that can be processed. Typically, wafers are soaked in the etching acid for a period of time. Thus, while the silicon nitride etch rate is fixed, the amount of silicon oxide removed will vary from lot to lot and hence the device dimensions will vary, resulting in varied performance. For obvious reasons, this is undesirable. Additionally, with continuous processing of wafers in this fashion, particles (from the etch by-products) will build up in the bath and eventually depositing on the wafers, as depicted in FIG. 4. The on-wafers particles remain at an acceptable level (<40 @0.16 um) for up to 20×50×200 mm wafers processed in the bath (1500 A were removed from each wafers). At that point, the bath needs to be drained and filled again with fresh acid to start a new processing cycle. In this scenario, it takes about 2 hours to drain/fill/heat the bath, which minimizes the utilization of the bath. Thus, the variability of etch rate is the main drawback for existing silicon nitride etch systems and methods.

SUMMARY OF THE INVENTION

It is therefore an object of the present invention to provide a system and method for etching silicon nitride from at least one substrate that results in increased etching selectivity of silicon nitride to silicon oxides.

Another object of the present invention to provide a system and method for selectively etching silicon nitride from at least one substrate that provides dynamic control of processing conditions and parameters.

Yet another object of the present invention to provide a system and method for etching silicon nitride from at least one substrate that provides dynamic control of processing conditions and parameters based on component concentration ratios and/or silicate concentration of the etching mixture.

Still another object of the present invention to provide a system and method for etching silicon nitride from at least one substrate that does not require an APC system (APC) at the IC fab level, but rather at the nitride etch tool level.

A further object of the present invention to provide a system and method for etching silicon nitride from at least one substrate that allows real time measurements of particle contaminants in a phosphoric (or phosphoric/sulfuric) bath.

A still further object of the present invention to provide a system and method for etching silicon nitride from at least one substrate that provides a stable silicon nitride etch rate, reduces variations in oxide etch rate, and/or reduces particle contaminations build up in the etchant.

A yet further object of the present invention to provide a system and method for etching silicon nitride from at least one substrate that affords high and stable selectivity of the etching over the entire bath life, stable silicon nitride and silicon oxide etch rates, minimum oxide loss, longer bath life (and hence lower cost of ownership), acceptable particle levels on the substrates, and/or a reduction in the number of processing steps.

These and other objects are met by the present invention, which in one aspect, is a method of etching silicon nitride from at least one substrate comprising: providing a closed-loop circulation system having a process chamber and a recirculation line fluidly coupled to the process chamber; supplying sulfuric acid, phosphoric acid, and water to the closed-loop circulation system in predetermined amounts so as to form a mixture having a predetermined concentration ratio and a predetermined volume, the mixture filling the process chamber and overflowing into the recirculation line; submerging at least one substrate in the mixture within the process chamber; circulating the mixture through the closed-loop circulation system; continuously measuring concentration ratio of the mixture with a concentration sensor; comparing the measured concentration ratio to the predetermined concentration value to determine whether the measured concentration value is within a predetermined range of the predetermined concentration ratio; and upon determining that the measured concentration ratio is not within the predetermined range of the predetermined concentration ratio, automatically feeding a volume of sulfuric acid, phosphoric acid, and/or water into the closed-loop circulation system while bleeding a substantially equal volume of the mixture from the closed-loop circulation system that will return the concentration ratio of the mixture back within the predetermined range during processing of the at least one substrate.

In one embodiment, this aspect of the inventive method can further comprise: continuously measuring particle counts in the mixture with a particle counter; comparing the measured particle count to a predetermined particle count to determine whether the measured particle count is greater than the predetermined particle count; and upon detecting the mixture having a particle count that is greater than the predetermined particle count, automatically bleeding a volume of the mixture from the closed-loop circulation system and feeding a substantially equal volume of sulfuric acid, phosphoric acid, and/or water into the closed-loop circulation system that will return the particle count of the mixture back to or below the predetermined particle count during processing of the at least one substrate.

In another aspect, the invention is a method of etching silicon nitride from at least one substrate comprising: (a) supplying sulfuric acid, phosphoric acid, and water to a process chamber in predetermined amounts so as to form a predetermined volume of mixture having a predetermined concentration ratio; (b) circulating the mixture through the process chamber in a closed-loop circulation system; (c) submerging at least one substrate in the mixture within the process chamber; (d) bleeding a volume of mixture from the closed loop system so as to reduce the effect of etch-byproducts in the circulating mixture; and (e) feeding phosphoric acid, sulfuric acid, and/or water to replace the volume of mixture bled from the closed loop; wherein the volume bled is selected to maintain or return the concentration ratio of the mixture to within a predetermined range of the predetermined concentration ratio.

In this aspect, the invention in some embodiments can be performed so that the bleeding and feeding of steps (d) and (e) is performed continuously or at set intervals. In other embodiments, this aspect of the invention can also comprise the steps of: (f) continuously measuring the concentration ratio of the mixture with a concentration sensor during processing of the at least one substrate; (g) comparing the measured concentration ratio to the predetermined concentration value to determine whether the measured concentration value is within a predetermined range of the predetermined concentration ratio; and (h) upon determining that the measured concentration ratio is not within the predetermined range of the predetermined concentration ratio, automatically performing steps (d) and (e).

In yet another aspect, the invention is a system for etching silicon nitride from at least one substrate comprising: a closed-loop circulation system having a process chamber and a recirculation line fluidly coupled to the process chamber; means for supplying sulfuric acid, phosphoric acid, and water to the closed-loop circulation system so as to form a predetermined volume of mixture having a predetermined concentration ratio; means for flowing the mixture through the closed-loop circulation system; a concentration sensor that continuously measures the concentration ratio of the mixture and produces a signal indicative of the measured concentration ratio during processing of at least one substrate in the process chamber; means for feeding sulfuric acid, phosphoric acid, and water to the closed-loop circulation system; means for bleeding the mixture from the closed-loop circulation system; and a processor operably coupled to the concentration sensor, the feeding means, and the bleeding means; wherein the processor is programmed so that upon receiving a signal indicative of a concentration ratio that is not within a predetermined range of the predetermined concentration ratio from the concentration sensor, the processor automatically activates the feeding means to add a volume of sulfuric acid, phosphoric acid, and/or water to the closed-loop circulation system and activates the bleeding means to drain a substantially equal volume of the mixture from the closed-loop circulation system during the processing of the at least one substrate that will return the concentration ratio of the mixture within the predetermined range of the predetermined concentration ratio.

In some embodiments, the inventive system may further comprise: a particle counter that continuously measures particle count of the mixture and produces a signal indicative of the measured particle count during processing of at least one substrate in the process chamber; wherein the processor is also operably coupled to the particle counter; and wherein the processor is further programmed so that upon receiving a signal indicative of a measured particle count above a predetermined particle count, the processor automatically activates the feeding means to add a volume of sulfuric acid, phosphoric acid, and/or water to the closed-loop circulation system and activates the bleeding means to drain a substantially equal volume of the mixture from the closed-loop circulation system during the processing of the at least one substrate that will return the particle count of the mixture back to or below the predetermined particle count.

In a still further aspect, the invention is a method of etching silicon nitride from at least one substrate comprising: providing a closed-loop circulation system having a process chamber and a recirculation line fluidly coupled to the process chamber; supplying a predetermined volume of an etchant to the closed-loop circulation system, the etchant filling the process chamber and overflowing into the recirculation line; submerging at least one substrate in the etchant within the process chamber; circulating the mixture through the closed-loop circulation system; continuously measuring particle count of the etchant with a particle counter; upon detecting the etchant having a measured particle count above a predetermined particle count, automatically bleeding a volume of contaminated etchant from the closed-loop circulation system while replacing the volume by feeding fresh etchant into the closed-loop circulation system during the processing of the at least one substrate that will return the particle count of the etchant within the closed-loop circulation system to or below the predetermined particle count.

DETAILED DESCRIPTION OF THE DRAWINGS

Figure 5:
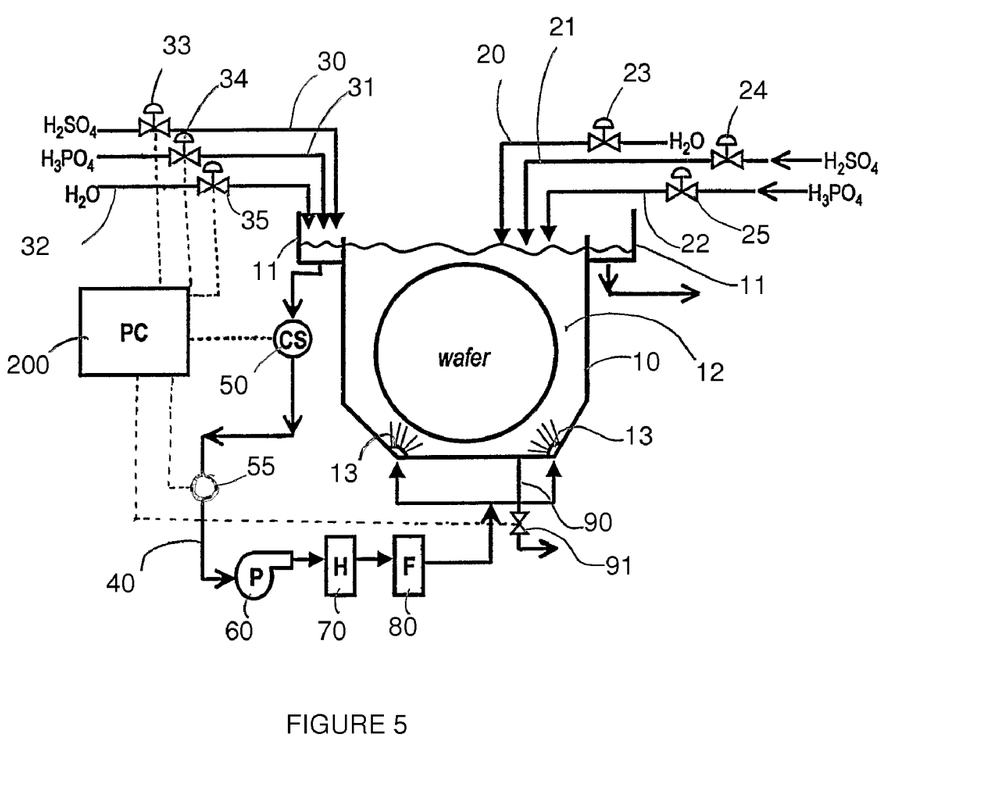
FIG. 5 is a schematic illustration of a selective etching system according to one embodiment of the present invention.

FIG. 1 is a schematic representation of a substrate etching system 100 according to an embodiment of the present invention. The substrate etching system 100 comprises a process chamber 10, a sulfuric acid ($H_2SO_4$) dispense line 20, a phosphoric acid ($H_3PO_4$) dispense line 21, a water ($H_2O$) dispense line 22, an $H_2SO_4$ feed line 30, an $H_3PO_4$ feed line 31, an $H_2O$ feed line 32, a recirculation line 40, a process controller 200, a concentration sensor 50, a particle counter 55, a pump 60, a heater 70, a filter 80, and a bleed line 90. Adjustable valves 23-25 are operably coupled to the dispense lines 20-22 respectively to control the flow of the respective fluids therethrough. Similarly, the adjustable valves 33-35 are operably coupled to the dispense lines 30-32 respectively to control the flow of the respective fluids therethrough.

While not illustrated, the $H_2SO_4$ dispense line 20 and the $H_2SO_4$ feed line 30 are each operably coupled to a source of $H_2SO_4$, such as an auxiliary drum or reservoir. The $H_2SO_4$ dispense line 20 and the $H_2SO_4$ feed line 30 can be coupled to the same or different sources of $H_2SO_4$, depending on processing needs and/or space restrictions. Similarly, the $H_3PO_4$ dispense line 21 and the $H_3PO_4$ feed line 31 are each operably coupled to a source of $H_3PO_4$. The $H_3PO_4$ dispense line 21 and the $H_3PO_4$ feed line 31 can be coupled to the same or different sources of $H_2SO_4$, depending on processing needs and/or space restrictions. The $H_2O$ dispense line 22 and the $H_2O$ feed line 32 are each operably coupled to a source of $H_2O$. $H_2O$ dispense line 22 and the $H_2O$ feed line 32 can be coupled to the same or different sources of $H_2SO_4$, depending on processing needs and/or space restrictions.

The process chamber 10 comprises a recirculation weir 11 and a processing volume 12. A pair of inlet manifolds 13 are provided at the bottom of the processing volume 12 of the process chamber 10 for introducing fluids into the processing volume 12. the processing volume 12 is of sufficient size such that plurality of wafers 14 can be supported therein. While the wafers 14 are illustrated as being supported in a vertical orientation, the wafers can also be oriented in a horizontal orientation. Additionally, the process chamber 10 can be designed for single-wafer processing.

The process chamber 10 also comprises a bleed line 90. The bleed line 90 is fluidly coupled to a bleed port (not illustrated) of the process chamber 10 so that liquids can be drained from the process volume 12 of the process chamber 10 during wafer processing. An adjustable bleed valve 91 is operably coupled to the bleed line 90 so that the flow rate (mass or volumetric) of fluids through the bleed line 90, and thus out of the closed-loop circulation system, can be controlled.

One end of the recirculation line 40 is fluidly coupled to a hole in the bottom of the recirculation weir 11 so that any liquid that overflows the processing volume 12 into the recirculation weir 11 can be drawn into the recirculation line 40 if desired. The other end of the recirculation line 40 is fluidly coupled to the inlet manifolds 13. The recirculation line 40 forms a fluid pathway from the recirculation weir 11 to the processing volume 12 of the process chamber 10. Thus, the recirculation line 40, combined with the process chamber 10, forms a closed-loop circulation system.

The pump 60, the heater 70, and the filter 80 are all operably and fluidly coupled to the recirculation line 40. As such, liquid that passes through the recirculation line 40, can be heated to a desired temperature by the heater 70. The filter 80 can remove ionic and/or particulate contaminants from the liquid as it passes through the recirculation line 40. The concentration sensor 50 and the particle counter 55 are also operably coupled to the recirculation line 40 so that they can take the appropriate measurements of any fluid passing through the recirculation line 40. The concentration sensor 50 can be any instrument capable of analyzing a mixture to determine the concentration ratio of its component parts, such as an NIR spectrometer or an FT-NIR spectrometer. The particle counter 55 can be any instrument capable of counting particles in a liquid, such as for example a liquid borne particle counter, which are standard in the art.

The process controller 200 is operably connected to the adjustable valves 33-35, the concentration sensor 50, the particle counter 55, and the bleed valve 91 for communication therewith. These operable connections can be facilitated via the appropriate electric, fiber-optic, cable, or other suitable connections. In FIG. 5, the operable connections of the component 33-35, 50, 55, 91 with the process controller 200 are illustrated as dotted lines. The process controller 200 is a suitable microprocessor based programmable logic controller, personal computer, or the like for process control and preferably includes various input/output ports used to provide connections to the various components 33-35, 50, 55, 91 of the etching system 100 that need to be controlled and/or communicated with.

The process controller 200 also preferably comprises sufficient memory to store process recipes, parameters, and other data, such as a predetermined (i.e. target) concentration ratio, a predetermined particle count, a predetermined range, flow rates, processing times, processing conditions, and the like. The process controller 200 can communicate with any and all of the various components of the etching system 100 to which it is operably connected in order to automatically adjust process conditions, such as activating flow through any one of feed lines 30-32 either alone or in combination, activating flow through bleed line 90, pump activation, heat application, and filtering. While not illustrated, the process controller 200 can also be operably coupled to the heater 70, the pump 60, the inlet manifolds 13, and the adjustable valves 23-25 if desired.

The process controller 200 is also programmed with the proper algorithms to receive data signals from the concentration sensor 55 and the particle counter 55, analyze the incoming data signals, compare the values represented by the incoming data signals to stored values and ranges, and automatically make the appropriate adjustments to the etchant being used to process the wafers 14 by feeding fresh etchant components into the circulation via lines 30-32 and/or bleeding contaminated/old etchant via bleed line 90 to achieve a predetermined characteristic within the etchant mixture. For example, the process controller 200 can store a predetermined value and a predetermined acceptable operating range for concentration ratio or particle count. This will be discussed in more detail below with respect to operation of the system 100. The type of process controller used depends on the exact needs of the system in which it is incorporated.

Operation of an etching system according to an embodiment of the present invention will be discussed. For ease of discussion, the method will be discussed in relation to the etching system 100 of FIG. 5 with the understating that other variations, modifications, and etching systems can be used to perform the etching process.

A plurality of wafers 14 in need of etching are provided. The wafers 14 preferably are silicon wafers for IC manufacturing and comprise layers of both silicon nitride ($Si_3N_4$) and silicon oxide ($SiO_2$) thereon. However, other types of substrates can be used, such as MEMS substrates, flat panel displays, etc. All valves 23-25, 33-35, 90 are in a closed position at the beginning of the process.

First, the adjustable valves 23-25 are switched to an open position so that liquid $H_2SO_4$, $H_3PO_4$, and $H_2O$ are dispensed via lines 20-22 into the processing volume 12 of the process chamber 10. As the $H_2SO_4$, $H_3PO_4$, and $H_2O$ are supplied to the processing volume 12 of the process chamber 10, the $H_2SO_4$, $H_3PO_4$, and $H_2O$ mix to form a mixture (i.e. an etchant solution). The adjustable valves 23-25 control the flow rates of the $H_2SO_4$, $H_3PO_4$, and $H_2O$ through dispense lines 20-22 so that the mixture is created so as to have a predetermined/desired concentration ratio of $H_2SO_4:H_3PO_4:H_2O$. In one embodiment, the mixture preferably has a concentration ratio of 2 parts $H_2SO_4$ (96% by weight), 2 parts $H_3PO_4$ (85% by weight), and 1 part $H_2O$. However, if desired, any concentration ratio can be used. Moreover, if desired, in some embodiments of the invention, only a single chemical can be used as the etchant, such as an $H_3PO_4$ only etchant.

The $H_2SO_4$, $H_3PO_4$, and $H_2O$ continues to be supplied via lines 20-22 into the processing volume 12 until the mixture overflows the processing volume 12 into recirculation weir 11 and into recirculation line 40. Once a predetermined volume of the etchant mixture is supplied to and formed in the closed-loop circulation system (i.e, the process chamber 10 and the recirculation line 40), the valves 23-25 are closed, thereby discontinuing the supply of $H_2SO_4$, $H_3PO_4$, and $H_2O$ to the process chamber 10.

At this point, the pump 60 is activated, causing a cyclical flow of the mixture from the process chamber 10 (via weir 11), through the recirculation line 40, and back into the process chamber 10 (via the inlet manifolds 13). As the mixture passes through the recirculation line 40, it passes through the heater 70 and the filter 80. The heater 60 preferably heats the mixture to a temperature within a range of about 160 to 180° C., and most preferably to a temperature of about 165° C. The mixture also passes by concentration sensor 50 and particle counter 55, which are both operably coupled to the recirculation line 40.

The concentration sensor 50 continuously measures the concentration ratio of the mixture (i.e. the ratio of $H_2SO_4$:$H_3PO_4$:$H_2O$) as the mixture passes by in the recirculation line 40. The continuous measurements of concentration levels can be performed many times per seconds so as to be essentially continuous or periodically according to a predetermined pattern. The concentration sensor 50 creates data signals indicative of the measured concentration ratio of the mixture and continuously transmits these signals to the process controller 200 for processing via its electrical connection. Similarly, the particle counter 55 also continuously measures the particle levels in the mixture as the mixture passes by in the recirculation line 40. The particle counter 55 creates data signals indicative of the measured particle count/level in the mixture and continuously transmits these signals to the process controller 200 for processing via its electrical connection.

Upon receipt of each data signal from the concentration sensor 50 and particle counter 55, the process controller 200 analyzes the data signals and compares the measured values to predetermined/desired values stored in its memory. More specifically, the measured concentration ratio is compared to a stored predetermined/desired concentration ratio to determine whether the measured concentration ratio is within a predetermined/acceptable range of the predetermined concentration ratio. The measured particle count is compared to a stored predetermined/desired particle count to determine whether the measured particle count is greater than the predetermined particle count. The predetermined concentration ratio is preferably within a range of 85% to 50% by weight phosphoric acid, 0% to 30% by weight sulfuric acid, and 15% to 20% by weight water. The predetermined/acceptable range of the concentration ratio is preferably +/−5% by weight. The predetermined particle count is preferably within a range of 10 to 1000 counts per milliliter (ml), and most preferably about 100 counts/ml at 0.2 μm.

Upon comparing the measured concentration ratio of the mixture flowing through the recirculation line 40 to the predetermined/desired concentration ratio, the process controller 200 determines whether the measured concentration ratio is within the predetermined range of the predetermined concentration ratio. Similarly, the process controller 200 also determines if the measured particle count of the mixture is greater than the predetermined particle count.

If the process controller 200 determines (1) that the measured concentration ratio is within the predetermined range of the predetermined concentration ratio and (2) that the measured particle count is equal to or below the predetermined particle count, no action is taken and the wafers 14 are ready for processing. However, if either (1) the measured concentration ratio is not within the predetermined range of the predetermined concentration ratio or (2) the measured particle count is not equal to or below the predetermined particle count, the process controller will take the appropriate feed and bleed actions to achieve acceptable an acceptable concentration ratio and an acceptable particle count in the mixture. The feed and bleed actions will be discussed in detail below.

Assuming that (1) that the measured concentration ratio is within the predetermined range of the predetermined concentration ratio and (2) that the measured particle count is equal to or below the predetermined particle count, the process controller sends a signal to a user interface indicating that the bath is ready for wafer etching/processing. At this time, the batch of wafers 14 are lowered into the processing volume 12 of the process chamber 10 until they are fully submerged in the mixture. The pump 60 continues to force flow of the mixture through the closed-loop circulation system during the entire loading and processing times. Both the concentration sensor 50 and the particle counter 55 continue to perform their respective measuring functions during wafer processing and loading.

As the wafers 14 are subjected to the mixture (i.e., the etchant), the silicon nitride is etched with a selectivity with respect to the silicon oxide. The silicon nitride process under normal conditions (165° C.) has a nitride etch rate of $55^{\pm 5}$ Å/min. Typical selectivity of a freshly prepared tank is approximately 40:1. This selectivity is not great enough for the shallow trench isolation (STI) processes of today. Most organizations want to limit the oxide loss to a few angstroms. As the mixture is used, phosphosilicates build up in the mixture and put a back reaction on the oxide etching, in effect, decreasing the oxide etch rate and raising the selectivity. This continues until the phosphosilicates reach saturation. At this time oxide deposition can occur, where the saturation effects can put a layer of phos-doped oxide on the wafer 14. Thus there is a "window" of processing opportunity between saturation and "sufficiently loaded" bath to process wafers with selectivity greater than 80:1, and possibly greater than 100:1. However, issues exist because the mixture needs to be "seasoned" with nitride dummies causing productivity loss and the bath life of the mixture to saturation is short again, causing lost productivity.

The etching system 100 is designed to regain the lost productivity by managing/controlling the level of silicates in the bath and keeping the silicates at a stable level. The etching system 100 does this by (1) closely monitoring the concentration ratio and/or the particle level of the mixture with the concentration sensor 50 and the particle counter 55 and/or (2) tightly controlling the concentration ratio and/or the particle level of the mixture concentration ratio with the automatic feed and bleed. In a typical feed and bleed process, a volume of fresh mixture (or components thereof) are added to the bath while an equal volume of "old" mixture is removed. As a result, the saturation of the phosphosilicates stays nearly constant. In addition to reduce the need to "condition" the bath of the mixture, a known volume of saturated solution needs to be kept to be added to the fresh solution so that even the initial selectivity is relatively high.

An example of the feed and bleed control concept according to an embodiment of the present invention will now be discussed. As the wafers 14 are subjected to the mixture and the silicon nitride and silicon oxide layers are selectively etched, etching by-products, including particles, build up in the mixture and the concentration ratio of the mixture will change. During this processing time, the concentration sensor 50 and the particle counter 55 continuously perform their respective measuring functions and the process controller 200 performs its data analysis functions as described above. The mixture continues to flow through the closed-loop circulation system and process the wafers 14 without any change until the process controller 200 determines that (1) the measured concentration ratio is not within the predetermined range of the predetermined concentration ratio or (2) the measured particle count is not equal to or below the predetermined particle count.

Turning first to particle level control, assume that the process controller 200 is monitoring the measured particle count and detects that the measured particle count is greater than the predetermined particle count. At this point, the process controller 200 simultaneously sends appropriate control signals to valves 33-35 and bleed valve 91. Upon receiving the control signals, the valves 33-35 and the bleed valve 91 are switched to an open the closed-loop circulation system via the bleed line 90. Opening the valves 33-35 feeds (i.e. adds) fresh $H_2SO_4$, $H_3PO_4$, and $H_2O$, in the desired ratio, to the closed-loop circulation system via the feed/spike lines 30-32. The process controller 200 opens the valves 33-35 and the bleed valve 91 so that the feed and bleed flow rates are precisely controlled on each line 90, 30-32.

The bleed valve 91 is maintained in the open position until a desired volume of the old mixture is removed from the closed-loop circulation system. The valves 33-35 are also maintained in the open position until a volume of the mixture (or its components) is added to the closed-loop circulation system. The volume of the old mixture bled from the closed-loop circulation system via bleed line 90 is substantially equal to the volume of the mixture (or its components) added to the closed-loop circulation system via feed lines 30-32. The feeding and bleeding is continued, while the wafers 14 continue to be processed, until a desired volume of the mixture has been bled and replaced that will return the particle count/level of the mixture within the closed-loop circulation system below the predetermined particle count. The user will program the appropriate volume to be bled and fed for various conditions based on measured particle level and the overall predetermined volume of mixture initially supplied to the process chamber 10. In this way, the particle levels (which are indicative of silicate levels) within the mixture can be dynamically controlled during wafer processing.

Turning now to concentration control, assume that the process controller 200 is monitoring the measured concentration ratio of the mixture flowing through the recirculation line 40 and determines that the measured concentration ratio is not within the predetermined range of the predetermined concentration ratio. At this point, the process controller 200 simultaneously sends appropriate control signals to valves 33, 34, and/or 35 and bleed valve 91. Upon receiving the control signals, the appropriate valve 33, 34 and/or 35 and the bleed valve 91 are switched to an open position. Opening the bleed valve 91 bleeds (i.e. drains) the old mixture from the closed-loop circulation system via the bleed line 90. Depending on the component(s) of the mixture that is at a decreased ratio, either $H_2SO_4$, $H_3PO_4$, and/or $H_2O$ is fed (i.e. added) to the mixture in the closed-loop circulation system via the feed/spike lines 30, 31, and/or 32 by activating the appropriate valve 33, 34, and/or 35. The process controller 200 opens the appropriate valve(s) 33, 34 and/or 35 and the bleed valve 91 so that the feed and bleed flow rates are precisely controlled on each line 90, 30-32.

The appropriate valve(s) 33, 34, and/or 35 is maintained in the open position until a volume of $H_2SO_4$, $H_3PO_4$, and/or $H_2O$ that is necessary to return the concentration ratio of the mixture remaining within the closed-loop circulation system to within the predetermined range from the predetermined concentration ratio. The bleed valve 91 is maintained in the open position until a volume of the old mixture, that is substantially equal to the volume of $H_2SO_4$, $H_3PO_4$, and/or $H_2O$ added, is removed from the closed-loop circulation system. The feeding and bleeding is continued, while the wafers 14 continue to be processed. The user will program the appropriate volume to be bled and fed for various conditions based on the deviation of the measured concentration ratio from the predetermined range and the overall predetermined volume of mixture initially supplied to the process chamber 10. In this way, the concentration ratio within the mixture can be dynamically controlled during wafer processing.

Figure 6:
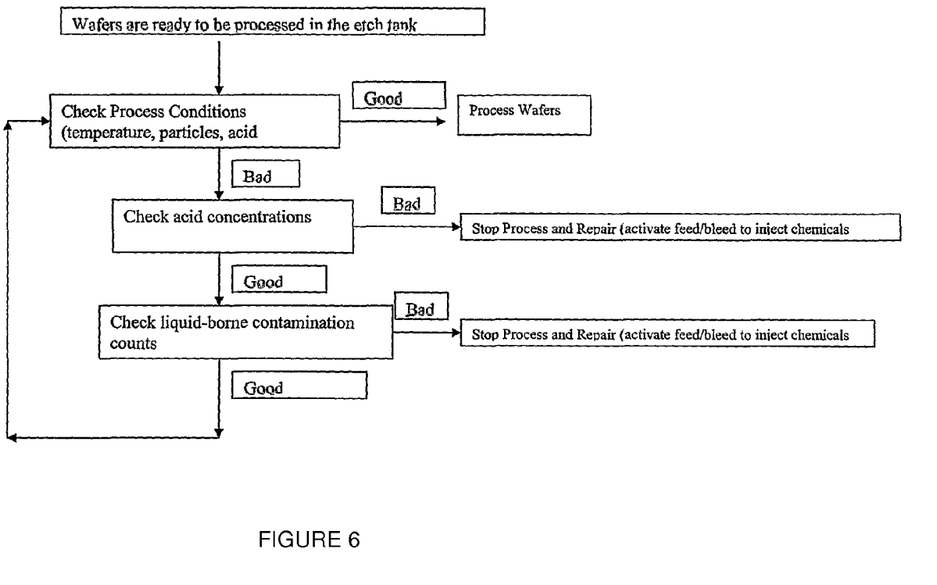
FIG. 6 is a high level flow chart followed by the system controller in operating the selective etching system of FIG. 5 according to one embodiment of the present invention.
Figure 7:
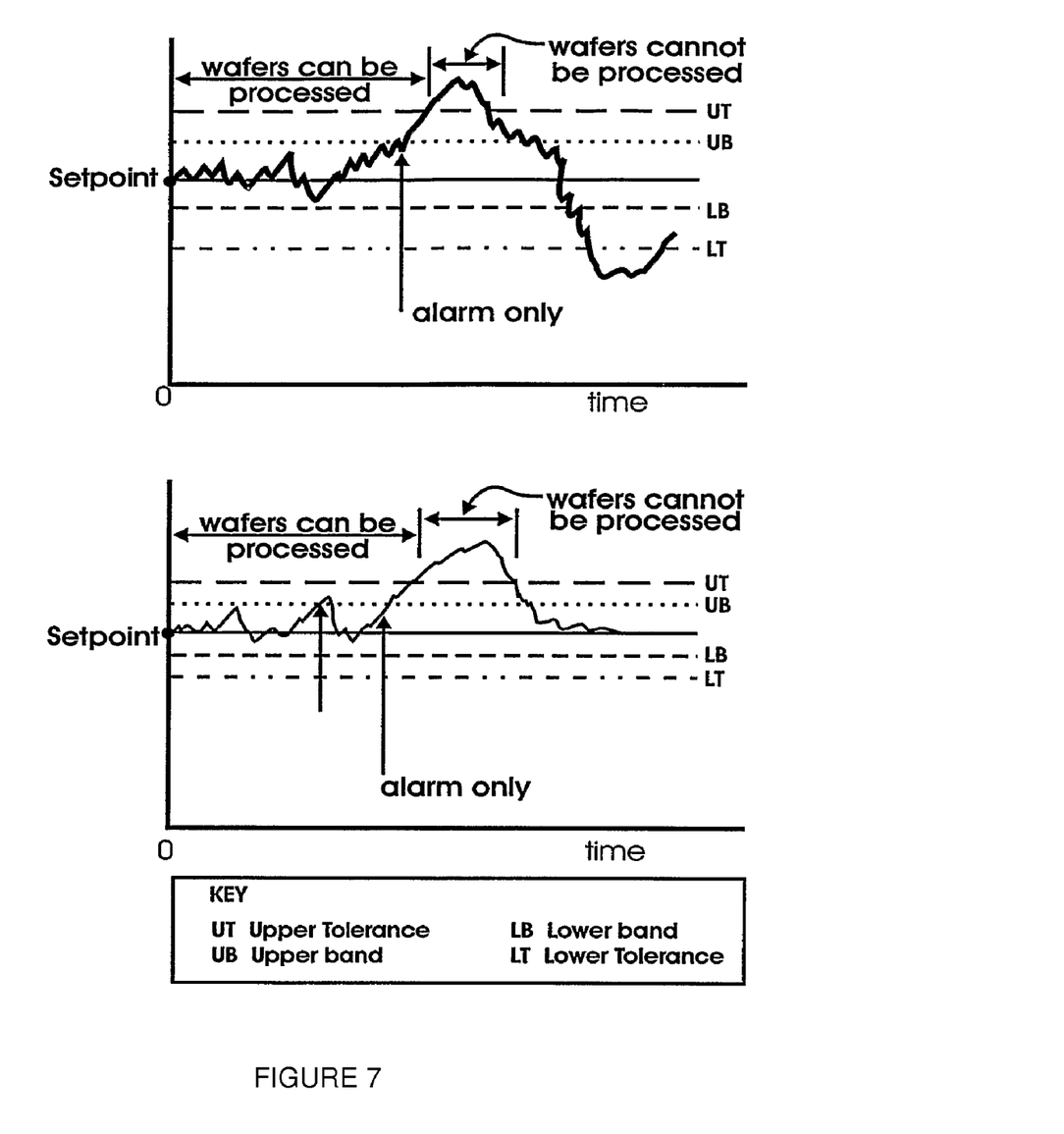
FIG. 7 is graph depicting a typical operation and control scheme of the nitride etch system of FIG. 5 measuring particle contamination levels according to one embodiment of the present invention.

FIG. 6 is a high level flowchart showing the programming functions carried out by the process controller 200 of the etching system 200 in carrying out the present invention. FIG. 7 is an example of how the process controller 200 monitors and compares the measured particle count to predetermined particle counts, ranges, and acceptable tolerances.

Depending on processing needs, the feed and bleed controls discussed above for particle levels and the concentration ratio can be implemented separately or combined in an etching system Moreover, the feed and bleed control of particle levels can be implements into etching systems and methods using a single chemical etchant, such as $H_3PO_4$ only. The invention has developed the software and hardware control scheme necessary to maintain the phosphosilicate saturation level as well as the water concentration, which, along with the temperature, is the prime factor of the nitride, etch rate.

In summary, the present invention overcome many of the problems of prior art etching systems and methods by implementing the aforementioned control scheme. Allowing the bath of the mixture to be partially drained and supplied with fresh mixture so the silicates concentration in the bath remains constant, the resulting etch rate of oxide will be also constant. As mentions, the concentration of silicates can be monitored by a liquid-borne particle counter. If the particles counts increase above the desired threshold, the system will allow the bath of the mixture to be partially drained and supplied with fresh mixture. The user will have to input the frequency and duration based on system loading and the resulting contamination counts as detected by the particle sensor (PS). The resulting nitride etch rate remains steady while the oxide etch rate decreases. Once the oxide etch rate reaches the lower allowable etch rate level (or particle counts), the bath of the mixture will be partially drained and filled back with a known volume of fresh acid bringing the particle counts (and hence the oxide etch rate to its acceptable level). This process will continue theoretically infinitely and the user decides to start a new cycle.

Example

An experiment was performed to test the effectiveness of two embodiments of the present invention. In carrying out the experiment, an acid bath was used to etch silicon nitride wafers. The bath was filtered, heated and filtered. Process sequence was chemical etching step, followed by rinse with de-ionized water, and then dry. The chemical step consisted of: Sulfuric acid 96%:Phosphoric acid (85% wt):water or phosphoric acid (85% wt):water. The chemical step consisted of either a mix of Sulfuric acid (96% wt), Phosphoric acid (85% wt) and water or a mix of phosphoric acid (85% wt) and 15% wt water. The following parameters and conditions were present and/or set:

Concentration control to maintain the mix ratio throughout the bath
Feed and bleed algorithm was activated
200 mm wafers with thermal nitride and oxide films.
System configured with recirculation and filtration
Bath temperature=165 deg. C.
Prior to testing, wafers were run through dilute HF or SC1 cleaning for surface normalization.
Etch rate measurement were performed using Rudolph S300 with 49 point measurements in 5 mm edge exclusion. Nitride loading effects were tested by processing full lots of nitride wafers for an extended period of time.
The following methods of control were used:
Feed and bleed: to reduce the effect of the etch by-products. A known volume of the bath will be drained and a supply of a known chemicals volume will be activated. The user will program the frequency and volumes of chemicals and/or water injected.
Liquid-borne particle counting instruments: to monitor the liquid borne particles resulting form the etch process.
Concentration sensor e.g. NIR, FT-NIR: the system will monitor the concentration of sulfuric acid, phosphoric acid and water. The user will select the setpoint and the system will maintain the setpoint by injecting the right constituent to adjust. For example, the system will inject sulfuric acid if it goes lower than the specified value.
Regulated acid(s) supply (phosphoric and/or sulfuric acids)
Regulated de-ionized water supply
Chemical concentration sensor(s)
Liquid borne particle counter
Control algorithm
Wafers were processed following the above-described scheme using two different etchants. In one experiment, the wafers were processed using the feed and bleed algorithm for a phosphoric acid only etchant. In another experiment, the wafers were processed using the feed and bleed algorithm for a phosphoric acid-sulfuric acid mixture etchant.

Phosphoric Acid Only Etch Example

Figure 8:
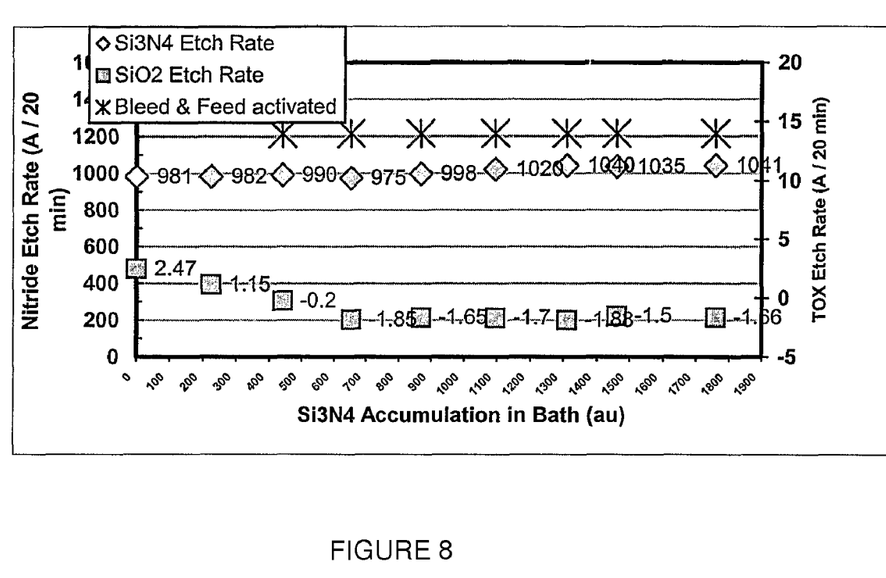
FIG. 8 is a graph illustrating stability of silicon nitride and silicon oxide etch rates using the feed and bleed algorithm for a phosphoric acid only etchant according to an embodiment of the present invention.

FIG. 8 is a graph illustrating stability of silicon nitride and silicon oxide etch rates using the feed and bleed algorithm for a phosphoric acid only etchant according to an embodiment of the present invention. As shown in FIG. 8, the nitride etch rate was about 50 A/min. while the oxide etch rate was 2.47 A, yielding a selectivity of 400:1. This is significantly higher than typically obtained in conventional fresh phosphoric baths. As shown in FIG. 8, the oxide etch rate starts to decrease with the number of wafers processed. Once the oxides reaches the lower allowable limit, the feed/bleed systems was activated to inject a known volume of phosphoric acid into the bath, thus bringing the etch rate to a need zero value. The system continues the feed/bleed and maintains the etch rate at average of ~−0.08 A/min. (or selectivity of theoretical infinity)(negative etch rate implies hypothetical film deposition).

Phosphoric Acid-Sulfuric Acid Mixture Etch Example

Figure 9:
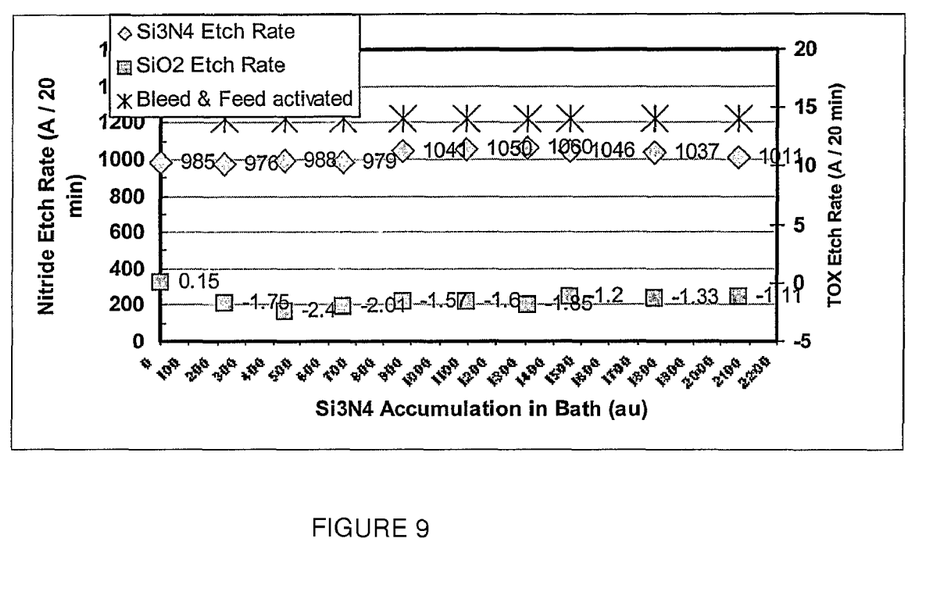
FIG. 9 is a graph illustrating stability of silicon nitride and silicon oxide etch rates using the feed and bleed algorithm for a phosphoric acid-sulfuric acid mixture etchant according to an embodiment of the present invention.

FIG. 9 is a graph illustrating stability of silicon nitride and silicon oxide etch rates using the feed and bleed algorithm for a phosphoric acid-sulfuric acid mixture etchant according to an embodiment of the present invention. As shown in FIG. 8 above, a known concentration of silicates (as indicated by in-line particle counting) must be maintained to achieve the desired selectivity. This requires the bath to be "seasoned" when used for the very first time (virgin bath). This issue can be overcome if a batch of dummy nitride wafers are processed in the bath to bring the silicates to the level that warrant the desired selectivity. This process obviously requires time to process these wafers i.e. lower tool utilization.

Another way to overcome this issue (seasoning) is to inject the phosphoric acid with a chemical that suppresses the oxide etch rate, hence yielding the desired selectivity. Sulfuric acid as a strong oxidant was added to the phosphoric acid and the results are shown in FIG. 9. As shown in FIG. 9, the oxide etch rate was at a minimum from the start. In addition, there is no decreasing trend of the oxide etch rate (while nitride etch remains always constant), yielding high selectivity from the start. The feed and bleed system was enabled to allow known volumes of phosphoric (and or sulfuric) to be added in order to maintain the silicates concentration (or particle counts) to steady value.

Typically, a particle-cleaning system is implemented as part of the total process step. This particle removal step is an SC1 (Standard Clean 1) that consists of processing the wafers in a mix of ammonium hydroxide, hydrogen peroxide and water and aided by megasonics. This step is very effective in removing these contaminants but if the contamination level is high enough, the particle removal efficiency will diminish.

Figure 10:
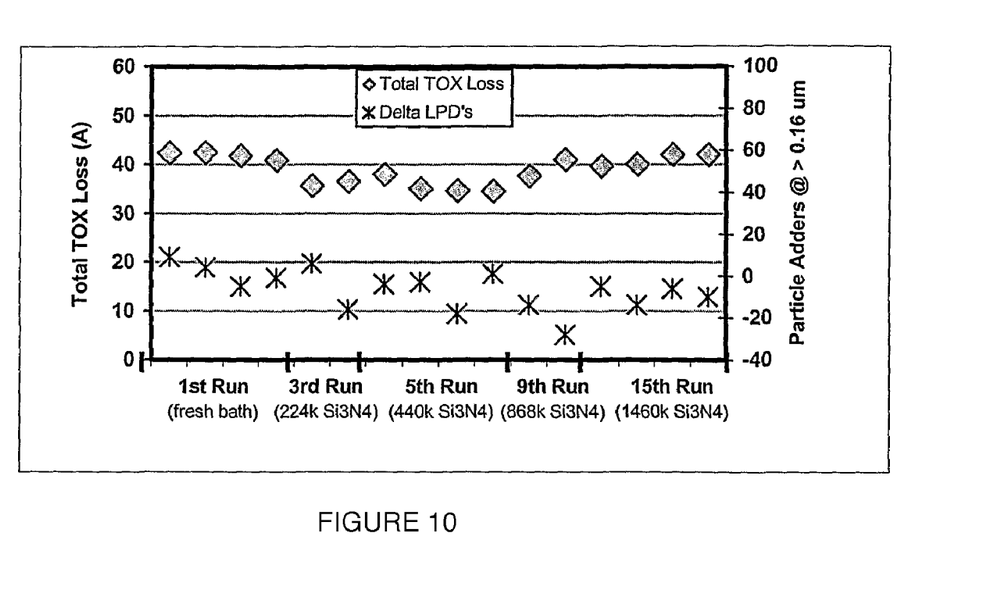
FIG. 10 is a graph illustrating the stability of particle contamination of wafers when processed according to an embodiment of the present invention.

In both examples described above, once the particle level in the bath was maintained at a minimum level, the on-wafer particle addition was also maintained to its lowest possible value. Results are shown in FIG. 10 where the average particle addition was kept a near zero value. These results are better than those shown in FIG. 4 where the average particle addition was greater than 40. In addition, there is no sudden increase in the particle counts since the particle counts were maintained steady due to the constant refreshing of the bath with phosphoric acid (or a mix of phosphoric and sulfuric acids).

The foregoing discussion discloses and describes merely exemplary embodiments of the present invention. As will be understood by those skilled in this art, the invention may be embodied in other specific forms without departing from the spirit or essential characteristics thereof. Specifically, the invention is not limited to any specific chemical make-up for the etchant used but can be used in combination with any etchant, irrespective of chemical make-up and or concentration ratio. Additionally, the invention can further include a system having capabilities and the equipment necessary to carry out only the concentration control, only the particle count control, or a combination of both. Accordingly, the disclosure of the present invention is intended to be illustrative, but not limiting, of the scope of the invention, which is set forth in the following claims.

The invention claimed is:

1. A method of etching silicon nitride from at least one substrate comprising:
   providing a closed-loop circulation system having a process chamber and a recirculation line fluidly coupled to the process chamber;
   supplying sulfuric acid, phosphoric acid, and water to the closed-loop circulation system in predetermined amounts so as to form a mixture having a predetermined concentration ratio and a predetermined volume, the mixture filling the process chamber and overflowing into the recirculation line;
   submerging at least one substrate in the mixture within the process chamber;
   circulating the mixture through the closed-loop circulation system;
   continuously measuring concentration ratio of the mixture with a concentration sensor;
   comparing the measured concentration ratio to the predetermined concentration value to determine whether the measured concentration value is within a predetermined range of the predetermined concentration ratio; and
   upon determining that the measured concentration ratio is not within the predetermined range of the predetermined concentration ratio, automatically feeding a volume of sulfuric acid, phosphoric acid, and/or water into the closed-loop circulation system while bleeding a substantially equal volume of the mixture from the closed-loop circulation system to return the concentration ratio of the mixture back within the predetermined range, the feeding and the bleeding occurring during processing of the at least one substrate.

2. The method of claim 1 wherein the sulfuric acid, phosphoric acid, and water are initially supplied to the process chamber via dispense lines.

3. The method of claim 1 wherein the volume of sulfuric acid, phosphoric acid, and/or water added to the mixture during the feeding step are supplied via spike lines.

4. The method of claim 1 wherein the predetermined concentration ratio is approximately 2 parts sulfuric acid, 2 parts phosphoric acid, and 1 part water.

5. The method of claim 1 further comprising filtering the overflowed mixture.

6. The method of claim 1 further comprising:
   continuously measuring particle counts in the mixture with a particle counter;
   comparing the measured particle count to a predetermined particle count to determine whether the measured particle count is greater than the predetermined particle count; and
   upon detecting the mixture having a particle count that is greater than the predetermined particle count, automatically bleeding a volume of the mixture from the closed-loop circulation system and feeding a substantially equal volume of sulfuric acid, phosphoric acid, and/or water into the closed-loop circulation system to return the particle count of the mixture back to or below the predetermined particle count, the feeding and bleeding occurring during processing of the at least one substrate.

7. The method of claim 1 wherein the mixture is circulated through the closed-loop circulation system during the feeding of sulfuric acid, phosphoric acid, and/or water into the closed-loop circulation system and during the bleeding of the mixture from the closed-loop circulation system.

8. The method of claim 1 further comprising heating the mixture prior to submerging the at least one wafer therein.

9. The method of claim 8 wherein the mixture is heated to a temperature at or near 160-180° C.

10. The method of claim 9 wherein the mixture is heated to a temperature at or near 165° C.

11. A method of etching silicon nitride from at least one substrate comprising:
   (a) supplying sulfuric acid, phosphoric acid, and water to a process chamber in predetermined amounts so as to form a predetermined volume of mixture having a predetermined concentration ratio;
   (b) circulating the mixture through the process chamber in a closed-loop circulation system;
   (c) submerging at least one substrate in the mixture within the process chamber;
   (d) bleeding a volume of mixture from the closed loop system so as to reduce the effect of etch-by-products in the circulating mixture; and
   (e) feeding phosphoric acid, sulfuric acid, and/or water to replace the volume of mixture bled from the closed loop;
   wherein the volume bled is selected to maintain or return the concentration ratio of the mixture to within a predetermined range of the predetermined concentration ratio; and
   wherein the bleeding and feeding of steps (d) and (e) occur during processing of the at least one substrate.

12. The method of claim 11 wherein the bleeding and feeding of steps (d) and (e) are performed continuously or at set intervals.

13. The method of claim 11 further comprising:
   (f) continuously measuring the concentration ratio of the mixture with a concentration sensor during processing of the at least one substrate;
   (g) comparing the measured concentration ratio to the predetermined concentration value to determine whether the measured concentration value is within a predetermined range of the predetermined concentration ratio; and
   (h) upon determining that the measured concentration ratio is not within the predetermined range of the predetermined concentration ratio, automatically performing steps (d) and (e).

14. The method of claim 11 wherein the mixture is circulated through the process chamber in the closed-loop circulation system during the bleeding and feeding of steps (d) and (e).

15. A method of etching silicon nitride from at least one substrate comprising:
   providing a closed-loop circulation system having a process chamber and a recirculation line fluidly coupled to the process chamber;
   supplying a predetermined volume of an etchant to the closed-loop circulation system, the etchant filling the process chamber and overflowing into the recirculation line;
   submerging at least one substrate in the etchant within the process chamber;
   circulating the etchant through the closed-loop circulation system;
   continuously measuring particle count of the etchant with a particle counter;
   upon detecting the etchant having a measured particle count above a predetermined particle count, automatically bleeding a volume of contaminated etchant from the closed-loop circulation system while replacing the volume by feeding fresh etchant into the closed-loop circulation system during the processing of the at least one substrate to return the particle count of the etchant within the closed-loop circulation system to or below the predetermined particle count.

16. The method of claim 15 wherein the etchant is circulated through the closed-loop circulation system during the bleeding of contaminated etchant from the closed-loop circulation system and during the feeding of fresh etchant into the closed-loop circulation system.

* * * * *